United States Patent [19]
Tanaka et al.

[11] Patent Number: 5,643,369
[45] Date of Patent: Jul. 1, 1997

[54] PHOTOELECTRIC CONVERSION ELEMENT HAVING AN INFRARED TRANSMISSIVE INDIUM-TIN OXIDE FILM

[75] Inventors: Hiroyuki Tanaka; Kaoru Torikoshi, both of Minami-ashigara, Japan

[73] Assignee: Fuji Xerox Co., Ltd., Tokyo, Japan

[21] Appl. No.: 607,202

[22] Filed: Feb. 26, 1996

Related U.S. Application Data

[63] Continuation of Ser. No. 271,627, Jul. 7, 1994, abandoned.

[30] Foreign Application Priority Data

Jun. 24, 1993 [JP] Japan ..................................... 5-152530
Jul. 7, 1993 [JP] Japan ..................................... 5-167855

[51] Int. Cl.$^6$ ........................................... H01L 31/04
[52] U.S. Cl. ........................................... 136/256; 257/431
[58] Field of Search ............................... 136/256; 257/431

[56] References Cited

FOREIGN PATENT DOCUMENTS 54-28396 9/1979 Japan .
62-142365 6/1987 Japan ..................................... 136/256

OTHER PUBLICATIONS

*Electroceramics*, Japan, May 1985, pp. 23–29.
R. Banerjee et al, *Solar Energy Materials*, vol. 13, pp. 11–23 (Jan. 1986).
H.B. Saim et al, *Solar Energy Materials*, vol. 13, pp. 85–96 (Feb.–Mar. 1986).

*Primary Examiner*—Aaron Weisstuch
*Attorney, Agent, or Firm*—Oliff & Berridge

[57] ABSTRACT

A photoelectric conversion device comprising a photoelectric conversion element having a photosensitivity to at least near infrared radiation and an indium oxide containing transparent film having a sufficient light transmission property to at least the near infrared radiation formed on the photoelectric conversion element is disclosed.

4 Claims, 3 Drawing Sheets

PHOTOELECTRIC CONVERSION ELEMENT HAVING AN INFRARED TRANSMISSIVE INDIUM-TIN OXIDE FILM

This is a continuation of application Ser. No. 08/271,627 filed Jul. 7, 1994, now abandoned.

BACKGROUND OF THE INVENTION

1. Field of the Invention

The present invention relates to a photoelectric conversion element having an indium oxide-containing transparent conductive layer prepared by a coating and thermal decomposition method.

2. Prior Art

Thin metal films such as gold, silver, aluminum, and metal oxides such as zinc oxide and ITO (Indium-Tin-Oxide) are generally known as a transparent conductive layer for use in solar cells. Sputtering methods and vapor deposition methods are well known as methods for preparing the ITO. (Electroceramics, '85. May, p. 23 (1985)). A method for preparing an indium oxide coating film by a coating and thermal decomposition method is described in Japanese Patent Publication No. Sho 54-28396.

However, the thin metal films such as gold, silver, and aluminum had low light transmission and the zinc oxide film having a high light transmission in the spectral range from the visible to the infrared had a low conductivity. In addition, the ITO transparent conductive layer prepared by a sputtering method or vapor deposition method had a high conductivity but the preparation process thereof was complicated and the layer had no infrared transmission. Thus, there was no transparent conductive material for use in solar cells having a high conductivity and a high light transmission property in the range from visible to infrared. Further, there was no disclosure of a combination of an indium oxide film prepared by a coating and thermal decomposition method having infrared transmission and a high conductivity, and a photoconductive material having a photosensitivity to infrared rays.

SUMMARY OF THE INVENTION

Thus, the object of the present invention is to provide a photoelectric conversion device having a high light conversion efficiency by utilizing the infrared energy of solar light effectively by combining a transparent conductive layer having a high light transmission in the range from visible to infrared and a high conductivity, with a photoelectric conversion element layer comprising a photoconductive material having a photosensitivity to infrared rays.

The aforementioned object of the present invention can be attained by combining an indium oxide containing transparent conductive layer formed by coating an organic indium compound containing solution and thermally decomposing it, and a photoelectric conversion element layer comprising a photoconductive material having a photosensitivity to infrared rays.

In accordance with the present invention, there is provided a photoelectric conversion element having a sensitivity at to the near infrared region and an indium oxide containing transparent film having a sufficient light transmission property to at least near infrared rays formed on the photoelectric conversion element.

The term "near infrared region" used in this application means light having a wavelength in the range from 780 nm to 2000 nm.

The photoelectric conversion element of the present invention can be used in solar cells.

Referring to FIGS. 1(a) and 1(b), a solar cell utilizing the photoelectric conversion element of the present invention may be formed by laminating a transparent conductive layer (2), a photoelectric conversion element layer (3), and an electrode (4) (conductive layer), a photoelectric conversion element layer, and a transparent conductive layer (2) successively on a substrate (1), or by forming a transparent conductive layer (2) on a photoconductive element (3) and an electrode (4) (conductive layer) on the opposite side (see FIG. 1(b)). In addition, the photoelectric conversion element layer may have a laminated structure comprising a junction between p type and n type layers in order to generate photoelectromotive force. Further, the solar cell of the present invention may have another layer formed thereon. For example, a protective layer may be formed on the electrode (conductive layer) or the transparent conductive layer.

Since the ITO transparent conductive layer of the present invention has excellent heat resistance, a photoelectric conversion element layer and another layer can be formed on the ITO transparent conductive layer by a heating process, or a heat treatment can be performed after forming these layers. Moreover, it can be used at a high temperature.

DETAILED DESCRIPTION OF THE INVENTION

Figure 1A:
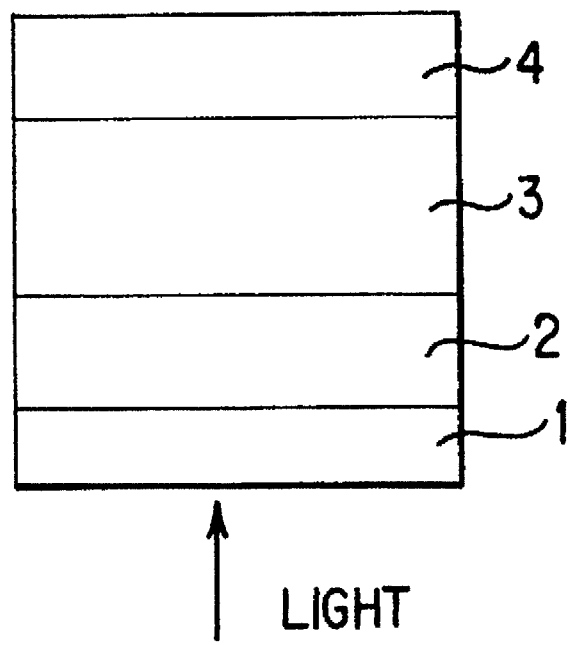
FIGS. 1(a) and (b) are schematic illustrations showing structures of solar cells.
Figure 1B:
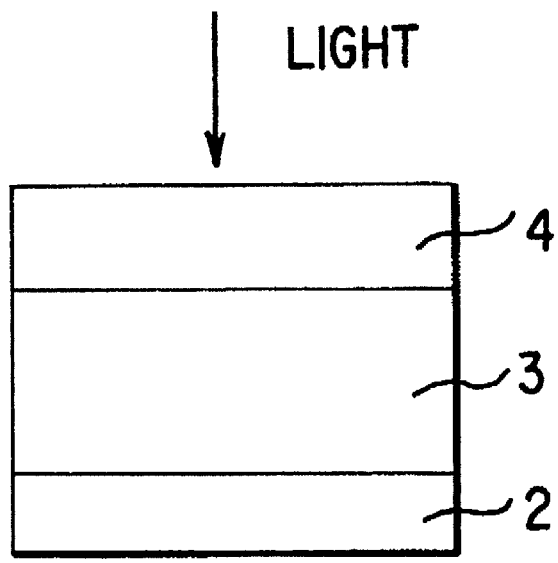

The transparent substrate used in the present invention may include quartz, non-alkali glass, and borosilicate glass. Each of these glasses has transmission in the near infrared-ray region. The thickness of the transparent substrate may not be limited. The organic indium compound used for forming a transparent conductive film may include $(R_1COO)_3In$ (wherein $R_1$ represents an alkyl group having 4 to 16 carbon atoms) and $(CH_3COCHCOCH_3)_3In$. In addition, in order to improve the conductivity, an organic tin compound may be added to the organic indium metal compound containing solution. The organic tin compound may include $(R_2COO)_2Sn$ (wherein $R_2$ represents an alkyl group having 4 to 16 carbon atoms) and $(CH_3COCHCOCH_3)_2Sn$. The amount of the organic tin compound added is preferably 0 to 40 wt. %, more preferably 5 to 35 wt % by molar ratio of tin/indium. If the molar ratio of tin is greater than the above values, the conductivity tends to become low. The solvent used for the organic indium compound containing solution may include most preferably an aliphatic hydrocarbon such as octane, decane, dodecane, and tridecane from a view point of wettability of the transparent substrate such as quartz, non-alkali glass, and borosilicate glass. However, any solvent having a solubility of the organic indium compound such as an aromatic hydrocarbon such as toluene and xylene and a hydrocarbon halide such as methylene chloride may be used. The solution concentration is preferably in the range from 5 to 50%, more preferably 10 to 40% based on a solids content ratio. In addition, as an additive, a cellulose derivative such as ethyl cellulose and nitro cellulose may be added to increase the adhesion to the substrate, or an unsaturated carboxylic acid such as linoleic acid and linolenic acid may be added to improve the wettability of the substrate. The amounts added are preferably in the range from 0 to 20%, respectively.

The coating method of the organic indium and other metal compound containing solutions include bar coating, spin coating, spray coating, screen printing, and dip coating methods.

The method for thermally decomposing the coating film of the organic indium compound containing solution may be carried out in an electric oven, at a temperature in the range from 400° to 1500° C. for 30 min. to 10 hours. If the calcining temperature is too low, the thermal decomposition of the organic indium compound becomes insufficient and the conductivity becomes low. If the calcining temperature is too high, the component(s) of the substrate will penetrate into the indium oxide film and the conductivity becomes low. The calcining time may be equal to or greater than 10 hours, but this is not particularly required. Calcination may be carried out in an air, a nitrogen, or an oxygen flow, a nitrogen or oxygen substituted atmosphere, and a reduced pressured atmosphere. The film thickness of the calcined oxide is preferably in the range from 0.05 to 10 µm, more preferably 0.1 to 5 µm. If the thickness is less than these values, the conductivity tends to become lower and if the thickness is greater than these values, the transparency tends to become reduced. In addition, the coating and thermal decomposition of the organic indium compound containing solution may be repeated in order to increase the film thickness.

The photoconductive material contained in the photoelectric conversion element layer may include an inorganic elemental or compound semiconductor such as silicon (in amorphous, single crystalline, or polycrystalline form), GaAs, CdS, and an organic semiconductor compound such as squarylium and phthalocyanine compounds. A photoconductive material having an absorption of infrared rays equal to or greater than 780 nm is usable. In addition, an additive such as boron or phosphorus may be added in order to provide p-type and/or n-type photoconductivity. The photoelectric conversion element layer may include a p-n junction, a Schottky barrier, and a BSF, but it is not limited to these types. The procedures for making the photoelectric conversion element layer include forming a photoelectric conversion element layer on a transparent conductive film formed on a substrate such as glass, and forming a transparent conductive film on a photoelectric conversion element layer. Further, the method for preparation may be selected from vapor deposition, plasma CVD, a casting, a CZ, a coating method, or dispersion in a resin, depending on the materials or structures of the photoelectric conversion element layer. However, the method is not limited to these. Further, since the transparent conductive film of the present invention has excellent heat resistance, the formation of a photoelectric conversion element layer requiring a heat treatment such as annealing or calcining a substrate on which a transparent conductive film is formed, or a heat treatment after the formation of the transparent conductive film and the photoelectric conversion element layer are possible.

The conductive layer used as a backside electrode includes metals such as gold, silver, platinum, and aluminum.

Since the transparent conductive film formed by coating and decomposing the organic indium compound containing solution has a high transmission of infrared rays, a solar cell in which it is combined with a photoelectric conversion element layer comprising a photoconductive material having a photosensitivity to infrared rays can have improved conversion efficiency because it has lower infrared ray loss. In addition, it acts as a reflection prevention film because it has a low reflection rate in the range from the visible to the infrared.

EMBODIMENT

The present invention will be hereunder described with examples and comparative examples.

EXAMPLE 1

A p-type polycrystalline silicon substrate doped with boron having a 10 cm$^2$ area and a 0.4 mm thickness and made by a casting method was doped with phosphorus on one side to form a 1 µm deep n-type silicon layer. A solution of 0.5 g of $(C_8H_{17}COO)_3In$ and 0.013 g of $(C_8H_{17}COO)_2Sn$ dissolved in 1.857 g of dodecane was coated on the n-type silicon layer with a wire bar (#10), dried at 45° C. for 30 min., calcined at 800° C. for one hour in air to form a transparent conductive film of $In_2O_3/SnO_2$ having a thickness of 0.2 µm on the polycrystal silicon substrate. Further, aluminum was deposited on the other p-type silicon surface of the polycrystalline silicon substrate to form a backside electrode layer having a film thickness of 1 µm. The conversion efficiency of the solar cell thus prepared was 7.8%.

EXAMPLE 2

A solution of 0.5 g of $(C_8H_{17}COO)_3In$ and 0.013 g of $(C_8H_{17}COO)_2Sn$ dissolved in 1.857 g of dodecane was coated on a quartz substrate with a wire bar (#10), dried at 45° C. for 30 min., calcined at 800° C. for one hour in an air to form a transparent conductive film of $In_2O_3/SnO_2$ having a thickness of 0.2 µm. On the film, a perylene compound layer having a thickness of 0.1 µm and a hydroxy squarylium compound layer having a film thickness of 0.1 µm were successively deposited to form a photoconductive conversion element layer. The structural formulas of perylene compound (I) and hydroxy squarylium compound (II) are shown below:

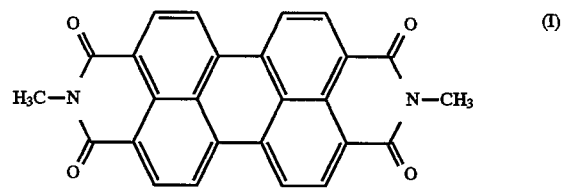

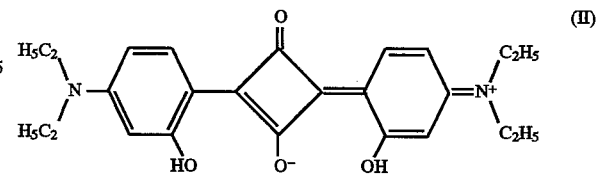

Further, gold was deposited on the organic compound layer to form an opposed electrode layer having a film thickness of 1 µm. The conversion efficiency of the solar cell thus prepared was 0.4%.

COMPARATIVE EXAMPLE 1

A solar cell was prepared using the method as described in Example 1, except that an ITO transparent conductive film having a film thickness of 0.2 μm was prepared by vacuum deposition. The conversion efficiency of the solar cell thus prepared was 6.8%.

COMPARATIVE EXAMPLE 2

A solar cell containing the hydroxy squarylium compound was prepared using the same method as described in Example 1, except that an ITO transparent conductive film having a film thickness of 0.2 μm was made by vacuum deposition on a quartz substrate. The conversion efficiency of the solar cell thus prepared was 0.3%.

Figure 2:
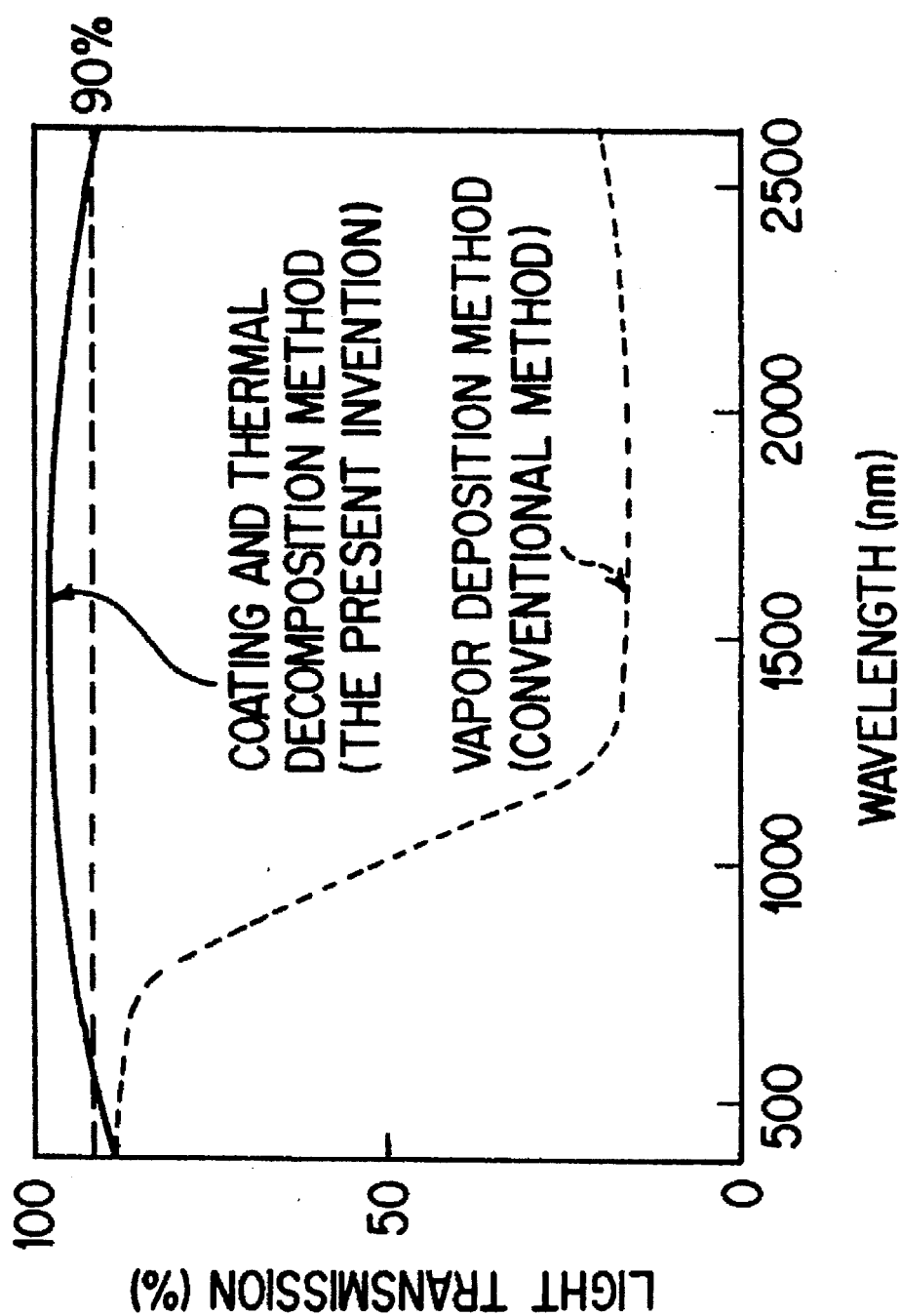
FIG. 2 is a graph showing and comparing the changes in light transmission of ITO conductive films prepared by the coating and thermal decomposition method of the present invention and by a conventional deposition method.

Comparing the ITO transparent conductive film prepared by vacuum deposition (Comparative Example) and the ITO transparent conductive prepared by the coating and thermal decomposition method (Example), the ITO transparent conductive film formed by coating and thermal decomposition method shows a high light transmission in the range from the visible to the infrared. On the other hand, the light transmission of the ITO transparent conductive film formed by vacuum deposition decreases from about 700 nm as shown in FIG. 2. Since there are differences in the light transmission at 700 nm and above between the ITO transparent conductive film made by vacuum deposition and the ITO transparent conductive film made by the coating and thermal decomposition method, the solar cell having the ITO transparent conductive film prepared by the coating and thermal decomposition method has a higher conversion efficiency than other solar cells using photoconductive materials having absorption in the infrared region. Besides the ITO transparent conductive film prepared by vacuum deposition, an ITO transparent conductive film prepared by a sputtering method also showed a decrease in light transmission from above 700 nm similar to the one prepared by vacuum deposition.

Figure 3:
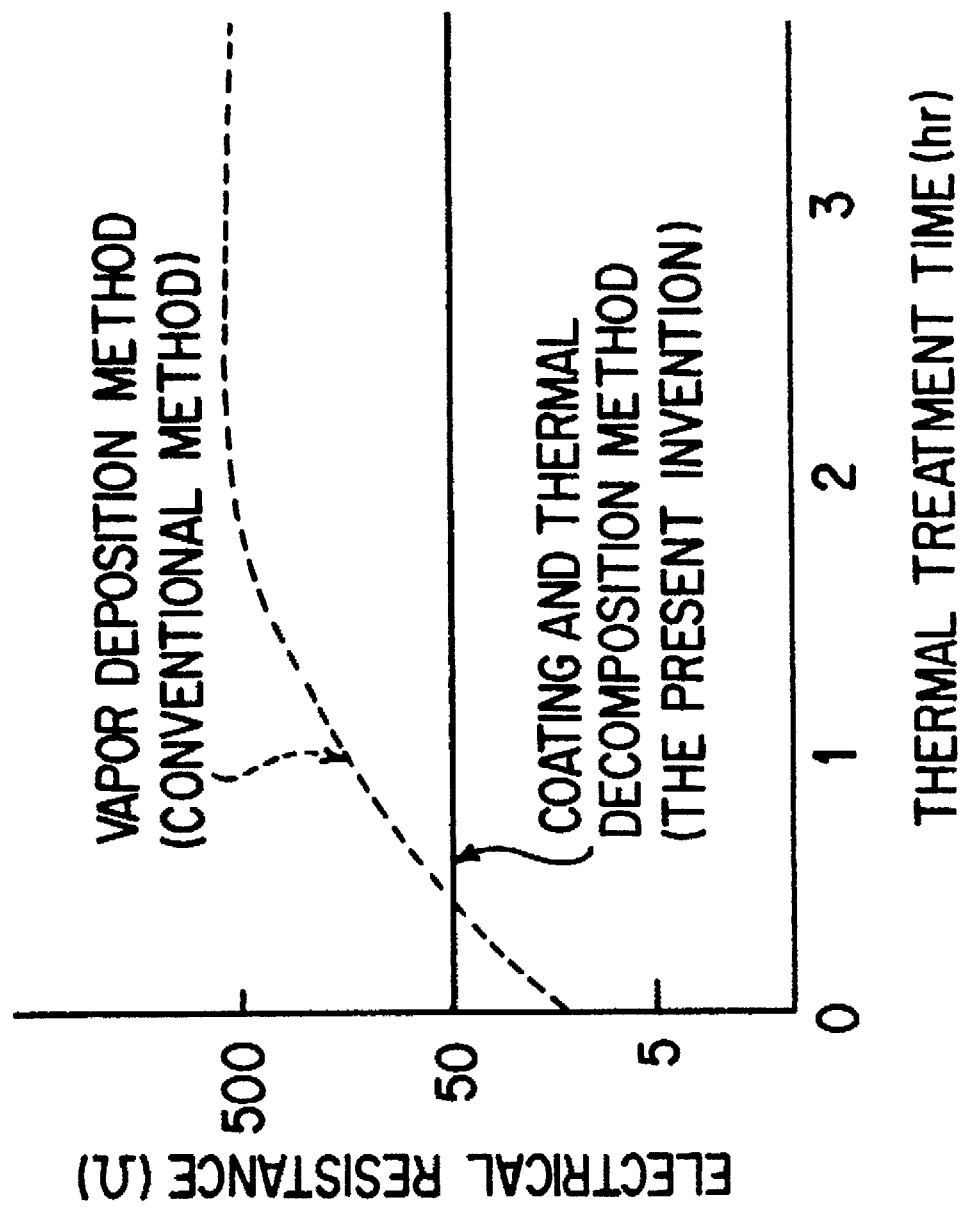
FIG. 3 is a graph showing and comparing the changes of electrical resistances of ITO conductive films prepared by the coating and thermal decomposition method of the present invention and by a conventional deposition method.

Comparing the heat resistances, the electrical resistance values of the ITO transparent conductive film by the coating and thermal decomposition were unchanged by thermal treatment, while on the other hand, the electrical resistance values of the ITO transparent conductive film formed by vacuum deposition increased as shown in FIG. 3. Thus the formation of a photoelectric conversion element layer by heat treatment of the ITO transparent conductive layer made by the coating and thermal decomposition method and by heat treatment after the formation of the transparent conductive film and the photoelectric conversion element layer can be employed. Therefore, the ITO transparent conductive film formed by the coating and decomposition method of the present invention can be applied to materials for windows used at high temperatures such as in electric ovens and to materials used for windows of airplanes and automobiles requiring electrical conductivity.

As described above, the present invention has the effect of increasing the photoconversion of a solar cell by combining a transparent conductive layer having a high light transmission in the range from the visible to the infrared and a high conductivity, with a photoconductive conversion element layer containing a photoconductive material having a photosensitivity to infrared rays.

In addition, by preparing a transparent conductive layer by the coating and thermal decomposition method of the present invention, the area can be easily increased without using complicated devices for sputtering or vapor deposition. Further, a transparent conductive layer may be prepared with a simple process so as to form a predetermined pattern, such as by coating and screen printing without an etching process, and thus the preparation process of a solar cell may be simplified. In addition, the solar cell of the present invention may be applied to power sources of various apparatuses and generators for electricity generation using clean solar energy.

While the present invention has been described in detail and with reference to specific embodiments thereof, it will be apparent to one skilled in the art that various changes and modifications can be made therein without departing from the spirit and scope thereof.

What is claimed is:

1. A photoelectric conversion device comprising a quartz substrate showing transparency to at least the near infrared region, an indium-tin-oxide containing transparent electrode; wherein said indium-tin-oxide containing transparent electrode is formed from a solution comprising an organic indium compound and an organic tin compound dissolved in an aliphatic hydrocarbon solvent, wherein said organic tin compound is chosen from $(R_2COO)_2Sn$, wherein $R_2$ is an alkyl group having 4–16 carbon atoms, or $(CH_3COCHCOCH_3)_2Sn$; and wherein said transparent electrode has 90% or more of light transmission to at least light having a wavelength in the range from 500 nm to 2,000 nm; a photoelectric conversion element having a photosensitivity to at least the near infrared region, and a second electrode, wherein said transparent electrode, said photoelectric conversion element and said second electrode are successively formed on said quartz substrate.

2. A photoelectric conversion device as claimed in claim 1, wherein the indium-tin-oxide transparent electrode is formed by coating said solution on the photoelectric conversion element or the quartz substrate and then thermally decomposing it.

3. A photoelectric conversion device comprising a quartz substrate showing transparency to at least the near infrared region, an indium-tin-oxide containing transparent electrode; wherein said indium-tin-oxide containing transparent electrode is formed from a solution comprising an organic indium compound and an organic tin compound dissolved in an aliphatic hydrocarbon solvent, wherein said organic tin compound is chosen from $(R_2COO)_2Sn$, wherein $R_2$ is an alkyl group having 4–16 carbon atoms, or $(CH_3COCHCOCH_3)_2Sn$; and wherein said transparent electrode has 90% or more of light transmission to at least light having a wavelength in the range from 500 nm to 2,000 nm; a photoelectric conversion element having a photosensitivity to at least the near infrared region, and a second electrode, wherein said second electrode, said photoelectric conversion element, and said transparent electrode are successively formed on said quartz substrate.

4. A photoelectric conversion device consisting essentially of an indium-tin-oxide containing transparent electrode; wherein said indium-tin-oxide containing transparent electrode is formed from a solution comprising an organic indium compound and an organic tin compound dissolved in an aliphatic hydrocarbon solvent, wherein said organic tin compound is chosen from $(R_2COO)_2Sn$, wherein $R_2$ is an alkyl group having 4–16 carbon atoms, or $(CH_3COCHCOCH_3)_2Sn$; and wherein said transparent electrode has 90% or more of light transmission to at least light having a wavelength in the range from 500 nm to 2,000 nm; a photoelectric conversion element having a photosensitivity to at least the near infrared region, and a second electrode, wherein said transparent electrode is formed on one side of said photoelectric conversion element and said second electrode is formed on the opposite side of said photoelectric conversion element.

* * * * *